United States Patent
Shintani et al.

(10) Patent No.: US 9,799,850 B2
(45) Date of Patent: Oct. 24, 2017

(54) ORGANIC EL DEVICE

(71) Applicant: PANASONIC CORPORATION, Osaka (JP)

(72) Inventors: Yoichi Shintani, Osaka (JP); Tatsuhiro Tomiyama, Miyagi (JP); Yasutaka Tsutsui, Osaka (JP)

(73) Assignee: PANASONIC CORPORATION, Osaka (JP)

(*) Notice: Subject to any disclaimer, the term of this patent is extended or adjusted under 35 U.S.C. 154(b) by 0 days.

(21) Appl. No.: 15/123,518

(22) PCT Filed: Jul. 10, 2014

(86) PCT No.: PCT/JP2014/003657
§ 371 (c)(1),
(2) Date: Sep. 2, 2016

(87) PCT Pub. No.: WO2015/136581
PCT Pub. Date: Sep. 17, 2015

(65) Prior Publication Data
US 2016/0372708 A1 Dec. 22, 2016

(30) Foreign Application Priority Data

Mar. 12, 2014 (JP) ................. 2014-049383

(51) Int. Cl.
*H01L 51/52* (2006.01)
(52) U.S. Cl.
CPC ...... *H01L 51/5259* (2013.01); *H01L 51/5253* (2013.01)
(58) Field of Classification Search
CPC .......... H01L 51/5259; H01L 51/5253
See application file for complete search history.

(56) References Cited

U.S. PATENT DOCUMENTS

| 5,443,922 A | 8/1995 | Nishizaki et al. |
| 6,465,953 B1 | 10/2002 | Duggal |

(Continued)

FOREIGN PATENT DOCUMENTS

| JP | H05-163488 A | 6/1993 |
| JP | 2001-068266 A | 3/2001 |

(Continued)

OTHER PUBLICATIONS

International Search Report and Written Opinion issued in corresponding International Patent Application No. PCT/JP2014/003657, dated Aug. 12, 2014; with partial English translation.

*Primary Examiner* — Roy Potter
*Assistant Examiner* — Paul Patton
(74) *Attorney, Agent, or Firm* — McDermott Will & Emery LLP

(57) ABSTRACT

An organic electroluminescence (EL) device whose organic EL layer is less likely exposed to moisture. The organic EL device includes an organic EL layer; and a hygroscopic layer disposed with respect to at least one main surface of the organic EL layer. The hygroscopic layer includes: a hygroscopic film containing a base material and a hygroscopic agent mixed in the base material; and a pair of covering films each covering a different one of surfaces of the hygroscopic film in a thickness direction of the hygroscopic film. A region of the hygroscopic film that is in contact with one covering film whose distance from the organic EL layer is smaller than a distance of the other covering film from the organic EL layer contains the hygroscopic agent at a content rate lower than an average content rate of the hygroscopic agent in the hygroscopic film.

6 Claims, 10 Drawing Sheets

(56) References Cited

U.S. PATENT DOCUMENTS

| | | |
|---|---|---|
| 2009/0001360 A1 | 1/2009 | Nakayama |
| 2012/0217535 A1* | 8/2012 | Van de Weijer .... H01L 51/5253<br>257/100 |

FOREIGN PATENT DOCUMENTS

| | | | |
|---|---|---|---|
| JP | 2002-056970 A | 2/2002 | |
| JP | 2009-031761 A | 2/2009 | |
| JP | 2009-090633 A * | 4/2009 | ............. H01L 51/50 |
| JP | 2009-090633 A | 4/2009 | |
| JP | 2011-246292 A | 12/2011 | |
| JP | 2012-533152 A | 12/2012 | |
| JP | 2013-049602 A | 3/2013 | |
| WO | 2011/005095 A1 | 1/2011 | |

* cited by examiner

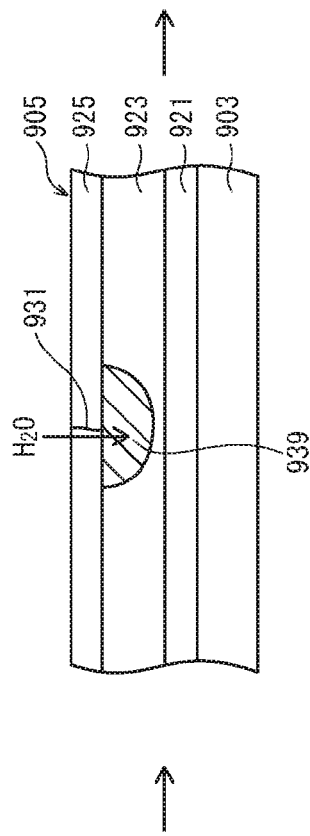
FIG. 5A State immediately after forming of water-resisting layer
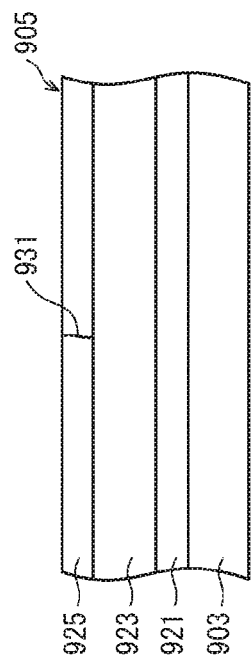
FIG. 5B State before forming of EL
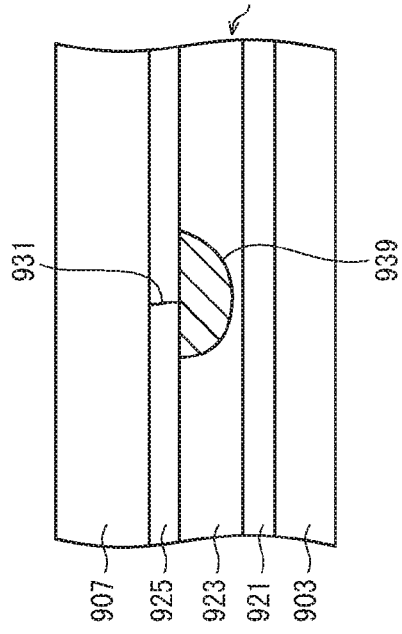
FIG. 5C State immediately after forming of EL
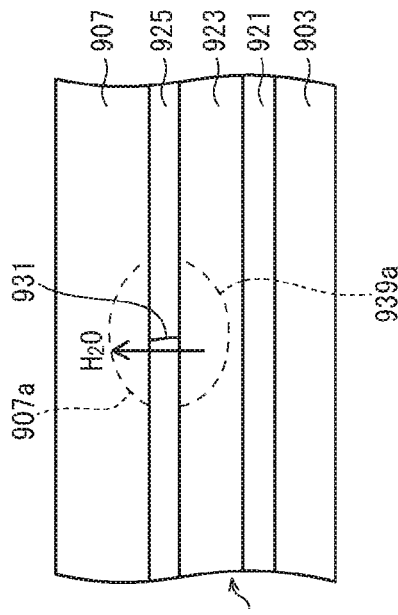
FIG. 5D State during heating following forming of EL State immediately after forming of water-resisting layer State before forming of EL State immediately after forming of EL State during heating following forming of EL

ORGANIC EL DEVICE

RELATED APPLICATIONS

This application is the U.S. National Phase under 35 U.S.C. §371 of International Patent Application No. PCT/JP2014/003657, filed on Jul. 10, 2014, which in turn claims the benefit of Japanese Application No. 2014-049383, filed on Mar. 12, 2014, the disclosures of which Applications are incorporated by reference herein.

TECHNICAL FIELD

The present disclosure relates to an organic electroluminescence (EL) device including an organic EL layer and a hygroscopic layer.

BACKGROUND ART

There has been used an organic EL device that for example includes, above a glass substrate, a display unit having an organic EL layer between an anode and a cathode.

In recent years, there has been a demand for organic EL display devices having excellent design and mobility. An organic EL display device having excellent design for example is that with a curved display unit. An organic EL display device having excellent mobility for example is that with reduced weight.

In response to the above demand, a technology has been proposed that uses, for an organic EL display device, a resin substrate (a resin film) that has flexibility and thus is bendable, instead of a glass substrate (for example, Patent Literature 1). However, a resin substrate typically does not function much as a barrier against moisture. For this reason, using a resin substrate leads to moisture intrusion into an organic EL layer through the resin substrate. This may result in a change in light-emission color, or even worse, in light emission incapability.

In view of this, a technology has been proposed that prevents moisture intrusion into the display unit (organic EL layer) by providing a hygroscopic layer between the resin substrate and the display unit to absorb/adsorb any moisture that may otherwise intrude into the display unit (for example, Patent Literatures 2 and 3).

The hygroscopic layer described in Patent Literature 2 has a configuration in which a hygroscopic film is sandwiched by a pair of inorganic films. The inorganic films are made of a material having a low moisture vapor transmission rate (indicates a degree of moisture transmission), whereby penetration of moisture into the hygroscopic layer is suppressed. Further, any moisture penetrating through the inorganic films is absorbed/adsorbed by the hygroscopic film.

The hygroscopic layer described in Patent Literature 3 has a configuration where a hygroscopic agent is mixed in an organic material, and an organic EL layer-side region of the hygroscopic layer contains the hygroscopic agent at a large amount.

CITATION LIST

Patent Literature

[Patent Literature 1]
Japanese Patent Application Publication No. 2009-031761

[Patent Literature 2]
Japanese Patent Application Publication No. 2012-533152

[Patent Literature 3]
Japanese Patent Application Publication No. 2001-068266

SUMMARY OF INVENTION

Technical Problem

However, it has been found that organic EL layer lifespan cannot be increased by using a hygroscopic layer that includes inorganic films with a low moisture vapor transmission rate, such as those disclosed in Patent Literature 2, and that is configured so that an organic EL layer-side region thereof contains the hygroscopic agent at a large amount. That is, it has been found that such a hygroscopic layer has an insufficient moisture intrusion prevention property.

The present disclosure aims to provide an organic EL device that prevents the intrusion of moisture into an organic EL layer at a high level.

Solution to Problem

One aspect of the present invention is an organic EL device including: an organic EL layer; and a hygroscopic layer disposed on at least one main surface of the organic EL layer, wherein the hygroscopic layer includes: a hygroscopic film containing a base material and a hygroscopic agent mixed in the base material; and a pair of covering films each covering a different one of surfaces of the hygroscopic film in a thickness direction of the hygroscopic film, and a region of the hygroscopic film that is in contact with one of the covering films whose distance from the organic EL layer is smaller than a distance of the other one of the covering films from the organic EL layer contains the hygroscopic agent at a content rate lower than an average content rate of the hygroscopic agent in the hygroscopic film.

Advantageous Effects of Invention

In the organic EL device pertaining to one aspect of the present invention has, the region of the hygroscopic film that is in contact with the organic EL layer-side covering film contains the hygroscopic agent at a content rate lower than the average content rate. This structure, without affecting the average content rate of the hygroscopic agent in the hygroscopic layer, reduces the number of hygroscopic agent grains exposed from the hygroscopic film in the direction of the organic EL layer, and thereby reduces the number of defects in the organic EL layer-side covering film. As a result, moisture intrusion into the organic EL layer is prevented at a high level. Further, the above-described structure increases the average distance between hygroscopic agent grains and the organic EL layer. Accordingly, the probability of moisture absorbed/adsorbed by the hygroscopic agent reaching the organic EL layer can be reduced.

BRIEF DESCRIPTION OF DRAWINGS

FIGS. 5A to 5D are diagrams for explaining changes in state of the considered hygroscopic layer during a manufacturing process of an organic EL device including the considered hygroscopic layer.

DESCRIPTION OF EMBODIMENTS

Aspects of the Invention

One aspect of the present invention is an organic EL device including: an organic EL layer; and a hygroscopic layer disposed on at least one main surface of the organic EL layer, wherein the hygroscopic layer includes: a hygroscopic film containing a base material and a hygroscopic agent mixed in the base material; and a pair of covering films each covering a different one of surfaces of the hygroscopic film in a thickness-direction of the hygroscopic film, and a region of the hygroscopic film that is in contact with one of the covering films whose distance from the organic EL layer is smaller than a distance of the other one of the covering films from the organic EL layer contains the hygroscopic agent at a content rate lower than an average content rate of the hygroscopic agent in the hygroscopic film.

In the organic EL device pertaining to one aspect of the present invention, the above-described region of the hygroscopic film is in contact with an entirety of the above-described one of the covering films. This structure reduces the number of hygroscopic agent grains exposed from the hygroscopic film in entirety in the direction of the organic EL layer, and thereby reduces the number of defects in the entirety of the organic EL layer-side covering film. Accordingly, the probability of moisture absorbed/adsorbed by the hygroscopic agent reaching the organic EL layer can be reduced over the entirety of the organic EL layer.

In the organic EL device pertaining to one aspect of the present invention, the above-described region of the hygroscopic film has a thickness greater than an average diameter of grains of the hygroscopic agent, and the above-described region of the hygroscopic film contains the hygroscopic agent at a content rate of 5 vol % or lower. These structures ensure that an organic EL layer-side surface of the above-described one of the covering films has planarity.

In the organic EL device pertaining to one aspect of the present invention, the above-described region of the hygroscopic film contains the hygroscopic agent at a content rate of 0 vol %. This structure provides the organic EL layer-side surface of the above-described one of the covering films with a higher level of planarity.

In the organic EL device pertaining to one aspect of the present invention, the hygroscopic agent is zeolite. This structure facilitates implementation.

First Embodiment

In a first embodiment, description is given on an outline of a device including a functional layer undergoing functional degradation through moisture sorption.

Description is given here on an organic EL device that includes an organic EL layer as a functional layer.

1. Overall Structure

Figure 1:
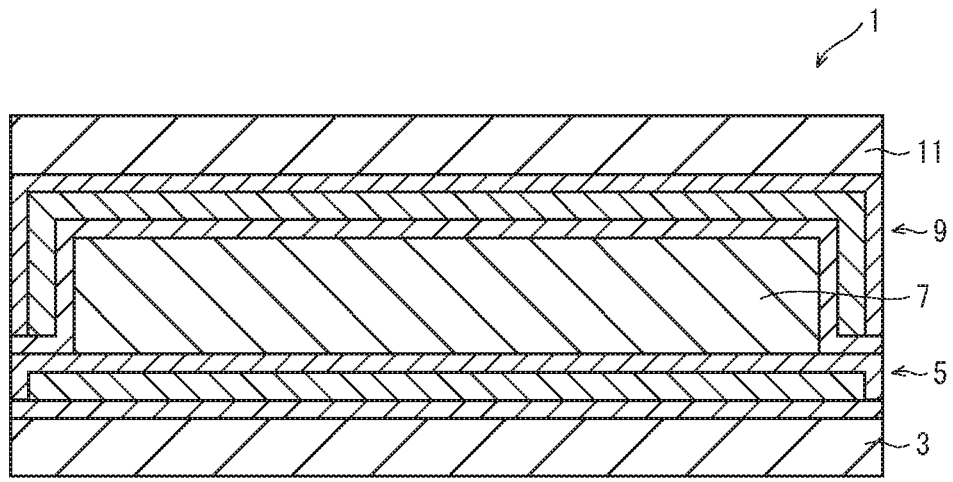
FIG. 1 is a cross-sectional diagram of a function device of a first embodiment.

FIG. 1 is a cross-sectional diagram of the organic EL device of the first embodiment.

The organic EL device 1 includes a display unit 7. The display unit 7 includes an anode electrode, a cathode electrode, and an organic EL layer disposed between the anode electrode and the cathode electrode.

The organic EL device 1 includes hygroscopic layers 5 and 9 respectively disposed on the two main surfaces of the display unit 7, and thus a hygroscopic layer is disposed on at least one main surface of the display unit 7. In other words, the display unit 7 is sandwiched between the hygroscopic layers 5 and 9.

Specific description is given below.

As shown in FIG. 1, the organic EL device 1 includes a base 3, the hygroscopic layer 5, the display unit 7, and the hygroscopic layer 9 disposed in the stated order. Here, the organic EL device 1 includes a surface covering layer 11, which opposes the display unit 7 with the hygroscopic layer 9 in between. Note that the front side of the organic EL device 1 is in the direction of the surface covering layer 11 and the back side of the organic EL device 1 is in the direction of the base 3.

(1) Base

The base 3 has a function of supporting the display unit 7, etc., and the hygroscopic layer 5, the display unit 7, the hygroscopic layer 9, and the surface covering layer 11 are disposed (layered) on the upper surface of the base 3.

The base 3 is made of a resin material, a ceramic material, a metal material, or the like. The organic EL device 1 pertaining to the present embodiment has flexibility and is bendable. Due to this, the base 3 is preferably formed by using a flexible resin material.

In consideration of the influence of moisture on the organic EL layer, the base 3 is preferably formed by using a material having a low transmission rate of moisture (hereinafter, referred to as a moisture vapor transmission rate). However, a resin film that is made of a resin material is preferably used as the base 3 to provide the base 3 with flexibility.

(2) Hygroscopic Layers

Each hygroscopic layer (hygroscopic layers 5, 9) has a function of preventing moisture having entered the organic EL device 1 via a surface (front or back surface) of the organic EL device 1 from intruding into the display unit 7 (referred to in the following as a moisture intrusion prevention function). The details of the hygroscopic layers 5, 9 are described later.

(3) Display Unit

The light emission performance of the display unit 7 is impaired by moisture having intruded into the organic EL layer, moisture absorbed/adsorbed by the organic EL layer, and the like. Specifically, the light emission performance of the display unit 7 is impaired when a change occurs in the characteristics of an organic material of the organic EL layer.

(4) Surface Covering Layer

The surface covering layer 11 covers the display unit 7. To be exact, the surface covering layer 11 is formed on the upper surface of the hygroscopic layer 9 in the state of a layer, and indirectly covers the display unit 7.

The surface covering layer 11 protects the display unit 7. Specifically, when the organic EL device 1 receives any mechanical shock, the surface covering layer 11 prevents the display unit 7 from being directly damaged. The surface covering layer 11 also has a function of preventing the penetration of moisture and/or gases such as oxygen into the display unit 7 to some extent.

The surface covering layer 11 is formed by using a material such as a resin film made of a resin material, a film of a nitride such as silicon nitride, a film of an oxide such as silicon oxide, or a metal film. The organic EL device 1 has flexibility as described above. For this reason, the surface covering layer 11 is made of a flexible resin material.

In consideration of the influence of moisture on the organic EL layer, the surface covering layer 11 is preferably formed by using a material having a low moisture vapor transmission rate. However, a resin material is preferably used for forming the surface covering layer 11 to provide the surface covering layer 11 with flexibility.

2. Hygroscopic Layer

Figure 2:
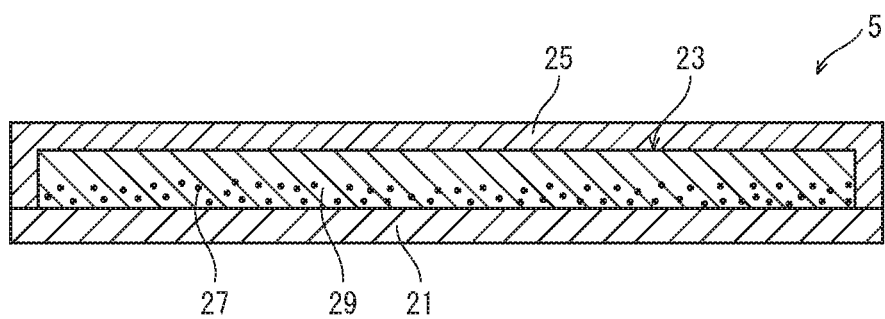
FIG. 2 illustrates a cross-section of a hygroscopic layer.
Figure 3:
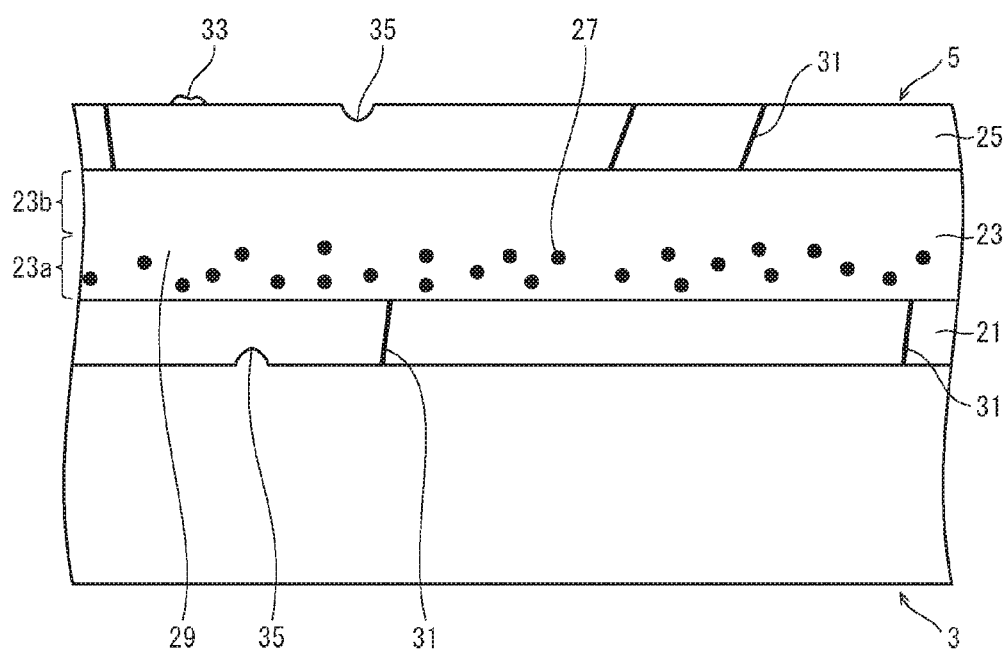
FIG. 3 is a cross-sectional diagram of a base with the hygroscopic layer formed thereon.

FIG. 2 illustrates a cross-section of one hygroscopic layer. FIG. 3 is a cross-sectional diagram illustrating the base with the hygroscopic layer formed thereon.

(1) Overall Structure

The hygroscopic layer 5 and the hygroscopic layer 9 may have the same structure or different structures. In the present embodiment, the hygroscopic layer 5 and the hygroscopic layer 9 have the same structure. As shown in FIG. 2, each hygroscopic layer (hygroscopic layers 5, 9) each include a first covering film 21, a hygroscopic film 23, and a second covering film 25. In each hygroscopic layer, the first covering film 21, the hygroscopic film 23, and the second covering film 25 are disposed in contact with one another. This means that the front surface and the back surface (both main surfaces) of the hygroscopic film 23 are covered by the first covering film 21 and the second covering film 25, respectively.

Each hygroscopic layer is dividable into two portions, a first portion that is close to the outside (i.e., close to the base 3 and the surface covering layer 11) and a second portion that is close to the display unit 7. Each hygroscopic layer includes the first covering film 21 in the first portion and the second covering film 25 in the second portion. That is, in each hygroscopic layer, the second covering film 25 is the one of the two covering films whose distance from the display unit 7 is smaller than the distance of the other one of the two covering films from the display unit 7.

In each hygroscopic layer, the first covering film 21 prevents moisture from the outside from intruding into the hygroscopic layer. Any moisture that passes through the first covering film 21 is absorbed/adsorbed by the hygroscopic film 23. The second covering film 25 prevents moisture having passed through the first covering film 21 and moisture once having been absorbed/adsorbed by the hygroscopic film 23 from intruding into the display unit 7. With this structure, each hygroscopic layer prevents moisture included in outside air from intruding into the display unit 7. That is, each hygroscopic layer also has the function of resisting the penetration of moisture.

(2) Covering Films

The first covering film 21 and the second covering film 25 may have the same structure or different structures. In the present embodiment, the first covering film 21 and the second covering film 25 have the same structure. For this reason, unless it is necessary to distinguish them from one another to specify arrangement position, etc., the first covering film 21 and the second covering film 25 are referred to by using the phrase "each covering film".

Each covering film is formed by using a material having a low moisture vapor transmission rate. Specifically, a material having a lower moisture vapor transmission rate than the materials used for forming the base 3 and the surface covering layer 11 is used for forming each covering film. More specifically, each covering film has a moisture vapor transmission rate of $1\times10^{-4}$ g/m²/day to $1\times10^{-6}$ g/m²/day, inclusive, in an atmosphere of 40 degrees Celsius and 90% relative humidity (RH). Note that each covering film preferably has as low a moisture vapor transmission rate as possible.

One example of a material having a low moisture vapor transmission rate is an inorganic film. Examples of inorganic films include a film of a nitride such as silicon nitride, a film of an oxide such as silicon oxide, a film of an oxynitride such as silicon oxynitride, and a film of a metal oxide such as indium tin oxide (ITO) or silver oxide. Such inorganic films are formed, for example, through vacuum vapor deposition such as chemical vapor deposition (CVD) or sputtering.

Meanwhile, each covering film, when formed by using an inorganic film, has extremely small defects 31 as illustrated in FIG. 3. The forming of such defects 31 in the manufacturing process cannot be avoided, and also, it is difficult to keep track of where the defects 31 have been formed in the manufacturing process. Accordingly, it is difficult to dispose local hygroscopic films where the defects 31 have been formed.

Here, it is assumed that moisture penetrates through the defects 31. For example, pin holes, etc., that locally occur in an inorganic film formed through vacuum vapor deposition correspond to the defects 31.

(3) Hygroscopic Film

In each hygroscopic layer, the hygroscopic film 23 absorbs/adsorbs moisture having entered the hygroscopic layer. Moisture mainly enters the hygroscopic layer via the defects 31 in the first covering film 21. Thus, the risk is reduced of moisture having entered the hygroscopic layer via the defects 31 in the first covering film 21 reaching the display unit 7.

The hygroscopic film 23 is formed by using a material containing a hygroscopic agent 27. Specifically, as shown in FIG. 2 and FIG. 3, the hygroscopic film 23 contains an organic material 29, which is one example of a base material, and the hygroscopic agent 27 mixed into the organic material 29.

The hygroscopic agent 27 is a chemical desiccant, a physical desiccant, or the like, and is in the state of grains. Chemical desiccants take advantage of inherent characteristics (chemical reaction, deliquescence, and so on) of chemical substances, and examples thereof include calcium oxide (CaO), calcium chloride (CaCl), barium oxide (BaO), and sodium hydroxide (NaOH). Physical desiccants take advantage of the tendency of moisture molecules of adhering to porous surfaces, and examples thereof include silica gel, aluminum oxide, molecular sieve, allophane, and zeolite.

Examples of the organic material 29 include acrylic resin, polycarbonate resin, polyethylene terephthalate resin, polyvinyl chloride resin, polystyrene resin, epoxy resin, and silicone resin.

The material of the organic material 29 is appropriately selected depending on the intended use of the display unit 7. For example, when the display unit 7 (and thus the hygroscopic layer 5) needs to have flexibility, a material having a low elastic modulus is preferably selected. Meanwhile, when the hygroscopic layer 5 needs to be light-transmissive, a light-transmissive material is selected. When manufacturing at a low cost is required, an all-purpose material is selected.

In the hygroscopic film 23, the hygroscopic agent 27 is mixed with the organic material 29 such that different thickness-direction regions of the hygroscopic film 23 contain the hygroscopic agent 27 at different amounts. Specifically, a region of the hygroscopic film 23 that is in contact with the second covering film 25, whose distance from the display unit 7 (organic EL layer) is smaller than a distance of the first covering film 21 from the display unit 7 (organic EL layer), contains the hygroscopic agent 27 at a content rate lower than an average content rate of the hygroscopic agent 27 in the hygroscopic film 23.

The content rate (vol %) of the hygroscopic agent 27 is defined as follows.

Content rate=(mass of hygroscopic agent per unit volume/mass of hygroscopic film per unit volume)×100

Alternatively, the following formula may be used to calculate content rate.

Content rate=total surface area of hygroscopic agent grains observed in cross-sectional area of hygroscopic film/cross-sectional area of hygroscopic film As illustrated in FIG. 3, the hygroscopic film 23 includes a high-content region 23a and a low-content region 23b, each of which is in the form of a layer. The high-content region 23a contains a large amount of hygroscopic agent grains 27, whereas the low-content region 23b does not contain much hygroscopic agent grains 27. This low-content region 23b is a region of the hygroscopic film 23 that contains the hygroscopic agent 27 at a content rate lower than an average content rate of the hygroscopic agent 27 in the hygroscopic film 23.

The low-content region 23b may not contain any hygroscopic agent grains 27 at all. Considering factors such as the planarity of the surface of the hygroscopic film 23 that comes in contact with the second covering film 25 and the occurrence of defects, the low-content region 23b preferably contains the hygroscopic agent 27 at a content rate no greater than half of the average content rate of the hygroscopic agent 27 in the hygroscopic film 23.

In the present embodiment, the hygroscopic film 23 includes one low-content region 23b and one high-content region 23a. In this situation, a virtual plane that passes through an approximate midpoint of the hygroscopic film 23 in terms of thickness and that is parallel to the main surfaces of the hygroscopic film 23 may be used as a reference. Specifically, when dividing the hygroscopic film 23 into a first portion located at a side of the virtual plane relatively close to the display unit 7 (a side closer to the second covering film 25 than the first covering film 21) and a second portion located at a side of the virtual plane relatively distant from the display unit 7 (a side closer to the first covering film 21 than the second covering film 25), the first portion (corresponding to the low-content region 23b) contains the hygroscopic agent 27 at a lower content rate than the second portion (corresponding to the high-content region 23a).

The hygroscopic film 23 can be provided with such regions containing the hygroscopic agent 27 at different content rates as explained in the following. For example, when arranging the first covering film 21 lower than the hygroscopic film 23, the hygroscopic film 23 can be provided with such regions by taking advantage of the difference between the specific gravity of the hygroscopic agent grains 27 and the specific gravity of the organic material 29 and by curing the organic material (resin material) 29 during or after the sinking of the hygroscopic agent grains 27. In this case, the lower portion of the hygroscopic film 23 becomes the high-content region 23a, and the higher portion of the hygroscopic film 23 becomes the low-content region 23b.

Meanwhile, when arranging the first covering film 21 higher than the hygroscopic film 23, the hygroscopic film 23 can be provided with such regions by first forming a resin layer (which corresponds to the low-content region 23b) containing only the organic material (resin material) 29 and not containing the hygroscopic agent 27 and then forming a layer containing the organic material 29 and the hygroscopic agent 27 mixed in the organic material 29. In this case, the earlier-formed resin layer becomes the low-content region 23b, and the later-formed layer becomes the high-content region 23a.

3. Manufacturing Method

The following describes one example of a manufacturing method of the organic EL device 1.

The organic EL device 1 is manufactured through the following processes.

(1) Preparing the base 3 (base preparation process)
(2) Forming the hygroscopic layer 5 on the upper surface of the base 3 (lower hygroscopic layer formation process)
(3) Forming the display unit 7 on the upper surface of the hygroscopic layer 5 (display unit formation process)
(4) Forming the hygroscopic layer 9 on the upper surface of the display unit 7 (upper hygroscopic layer formation process)
(5) Forming the surface covering layer 11 on the upper surface of the hygroscopic layer 9 (surface covering layer formation process)

The display unit 7 includes an organic EL layer.

The following describes these processes one-by-one.

(1) Base Preparation Process

When using a resin material for forming the base 3, a film of the resin material is prepared as the base 3.

(2) Lower Hygroscopic Layer Formation Process

The following description is provided based on an example where the first covering film 21 and the second covering film 25 are inorganic films (silicon nitride films), the hygroscopic agent 27 in the hygroscopic film 23 is aluminum oxide, and the organic material 29 is an acrylic resin material.

The lower hygroscopic layer formation process includes the following steps.

(i) Forming a silicon nitride film corresponding to the first covering film 21 on the base 3
(ii) Forming a hygroscopic film on the silicon nitride film
(iii) Forming a silicon nitride film corresponding to the second covering film 25 on the hygroscopic film For example, in each of Steps (i) and (iii), the silicon nitride film is formed through vacuum vapor deposition (e.g., CVD).

Further, in Step (ii), the hygroscopic film is formed by applying uncured organic material (resin material) 29 containing the hygroscopic agent 27 on the silicon nitride film (21) through spin-coating for example, and then drying and curing the applied material when a predetermined amount of time has elapsed. Here, the predetermined amount of time is that required for the hygroscopic agent grains 27 to sink within the uncured organic material (resin material) 29. This yields the hygroscopic film 23, in which different regions in the thickness direction contain the hygroscopic agent 27 at different content rates.

(3) Display Unit Formation Process

The display unit 7 is formed by using conventional technology.

For example, the anode is formed through vacuum vapor deposition (e.g., sputtering), the organic EL layer is formed by applying an ink containing an organic light-emitting material by using a printing method and then drying the applied ink, and the cathode is formed through vacuum vapor deposition.

(4) Upper Hygroscopic Layer Formation Process

Similar to the above, in this process, the first covering film 21 and the second covering film 25 are inorganic films (silicon nitride films), the hygroscopic agent 27 in the hygroscopic film 23 is aluminum oxide, and the organic material 29 is an acrylic resin material.

The upper hygroscopic layer formation process includes the following steps.

(i) Forming a silicon nitride film corresponding to the second covering film 25 on the display unit 7

(ii) Forming a hygroscopic film 23 on the silicon nitride film (iii) Forming a silicon nitride film corresponding to the first covering film 21 on the hygroscopic film 23

For example, in each of Steps (i) and (iii), the silicon nitride film is formed through vacuum vapor deposition (e.g., CVD).

Further, in Step (ii), the hygroscopic film 23 is formed as follows. First, uncured organic material (resin material) 29 not containing the hygroscopic agent 27 is applied on the silicon nitride film (25) through spin-coating for example, and then the applied material is dried and cured. Subsequently, uncured organic material (resin material) 29 containing the hygroscopic agent 27 is applied on the resin material layer not containing the hygroscopic agent 27 through spin-coating for example, and then the applied material is dried and cured. This yields the hygroscopic film 23, in which different regions in the thickness direction contain the hygroscopic agent 27 at different content rates.

(5) Surface Covering Layer Formation Process

In this process, the surface covering layer 11 is formed by using a resin material such as an acrylic resin. The forming of the surface covering layer 11 is performed by applying the resin material through spin-coating, and then curing the applied resin material.

4. Moisture in Manufacturing Process (1) Consideration

The following describes a consideration conducted by the present inventors regarding a hygroscopic layer capable of preventing moisture intrusion into an organic EL layer. Specifically, the present inventors conducted the consideration for a hygroscopic layer having a three-layer structure, namely composed of a first covering film, a hygroscopic film disposed on the upper surface of the first covering film and constituted of a resin material and a hygroscopic agent dispersed in the resin material, and a second covering film disposed on the upper surface of the hygroscopic film.

Through much consideration, the present inventors found that the organic EL layer undergoes quick degradation when a hygroscopic layer having the three-layer structure contains the hygroscopic agent at a large amount at a region thereof close to the organic EL layer.

The reasons for this are explained with reference to FIG. 4 and FIGS. 5A to 5D.

Figure 4:
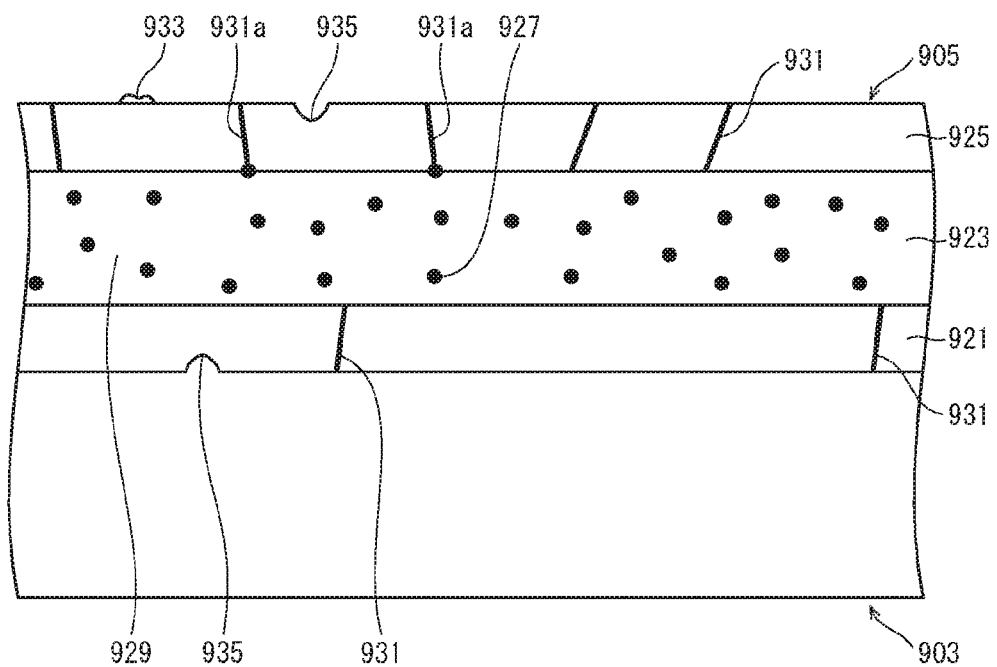
FIG. 4 is a diagram for explaining the structure of a considered hygroscopic layer.

FIG. 4 is a diagram for explaining the structure of the considered hygroscopic layer. FIGS. 5A to 5D are diagrams for explaining changes in state of the considered hygroscopic layer during a manufacturing process of an organic EL device including the considered hygroscopic layer.

FIG. 4 illustrates a base 903 formed by using a resin film, and a hygroscopic layer 905 disposed on the upper surface of the base 903. Specifically, as described above, the hygroscopic layer 905 includes a first covering film 921, a hygroscopic film 923, and a second covering film 925, layered in the stated order. The first covering film 921 is formed on the upper surface of the base 903, the hygroscopic film 923 is formed on the upper surface of the first covering film 921, and the second covering film 925 is formed on the upper surface of the hygroscopic film 923.

Although not illustrated in FIG. 4, a display unit 907 including an organic EL layer is formed on the upper surface of the second covering film 925 (see FIGS. 5A to 5D). Further, each covering film has defects 931 (e.g., pinholes) the forming of which in the manufacturing process cannot be avoided.

The hygroscopic film 923 is constituted of a hygroscopic agent 927 in the form of grains, and a resin material 929. The hygroscopic film 923 contains the hygroscopic agent 927 in a large amount, and the hygroscopic agent grains 927 are distributed substantially evenly over the entirety of the hygroscopic film 923. With this structure, hygroscopic agent grains 927 may be exposed at the upper surface of the hygroscopic film 923 and/or the upper surface of the hygroscopic film 923 may not have planarity (not illustrated in FIG. 4). Accordingly, the number of defects 931 formed in the second covering film 925 tends to increase. Note that in FIG. 4, defects caused by hygroscopic agent grains 927 exposed at the upper surface of the hygroscopic film 923 are specifically labelled as defects 931a.

The following explains the state of the resisting layer during the manufacturing process.

FIG. 5A illustrates a state immediately after formation of the hygroscopic layer 905 on the base 903. The hygroscopic layer 905 on the base 903 is exposed to ambient air while being stored or when supplied to a subsequent process. While the hygroscopic layer 905 is exposed to ambient air, moisture from the air intrudes into the hygroscopic film 923 via the defects 931 (including the defects 931a). The moisture having intruded into the hygroscopic film 923 is then absorbed/adsorbed by the hygroscopic agent 927, which is contained at a large amount in a region of the hygroscopic film 923 close to the second covering film 925 (close to the outside). In other words, the moisture is absorbed/adsorbed by a region of the hygroscopic film 923 close to the second covering film 925. This state is illustrated in FIG. 5B, in which hatching is used to indicate region 939 having absorbed/adsorbed a large amount of moisture.

Subsequently, the display unit 907 is formed on the upper surface of the second covering film 925. FIG. 5C illustrates a state immediately after the formation of the display unit 907. Then, the hygroscopic layer 905 and the display unit 907, as well as the base 903 on which they are disposed, are heated. This heating is performed, for example, in order to cure the resin material of the surface covering layer, and is illustrated in FIG. 5D.

During the heating, the moisture in the region 939, which contains a large number of hygroscopic agent grains 927 having absorbed/adsorbed moisture, spreads to region 907a, which is a region of the display unit 907 including an organic EL layer, via the defects 931.

As such, even though the hygroscopic layer 905 exists, degradation of the organic EL device due to moisture intrusion cannot be effectively prevented.

(2) Implementation Sample

Meanwhile, the organic EL device 1, which includes the hygroscopic layer 5 pertaining to the first embodiment, is capable of preventing degradation due to moisture intrusion. The reasons for this are explained in the following.

FIGS. 6A to 6D are diagrams for explaining changes in state of the hygroscopic layer pertaining to the first embodiment during a manufacturing process of an organic EL device including the hygroscopic layer.

As illustrated in FIG. 3, the hygroscopic layer 5 includes the first covering film 21, the hygroscopic film 23, and the second covering film 25 layered in the stated order. Although not illustrated in FIG. 3, the display unit 7, which includes an organic EL layer, is formed on the hygroscopic layer 5 as illustrated in FIG. 1. Further, the first covering film 21 and the second covering film 25 have the defects 31, the forming of which in the manufacturing process cannot be avoided as described above.

The hygroscopic film 23 contains the organic material 29 and the hygroscopic agent 27 mixed in the organic material 29 such that an upper portion thereof that includes a region that is in contact with the second covering film 25 contains the hygroscopic agent 27 at a content rate lower than the content rate of the hygroscopic agent 27 in a lower portion of the hygroscopic film 23 and an average content rate of the hygroscopic agent 27 in the hygroscopic film 23.

With this structure, the region of the hygroscopic film 23 that is in contact with the second covering film 25 does not contain much hygroscopic agent grains 27. Thus, not many hygroscopic agent grains 27 are exposed at the upper surface of the hygroscopic film 23, and the planarity of the upper surface of the hygroscopic film 23 is ensured. Accordingly, the second covering film 25 does not have much defects 31 caused by hygroscopic agent grains 27. As a matter of course, with a reduced number of defects 31, the amount of moisture intruding into the hygroscopic film 23 can be reduced.

The following explains the state of the hygroscopic layer 5 during the manufacturing process.

Figure 6A:
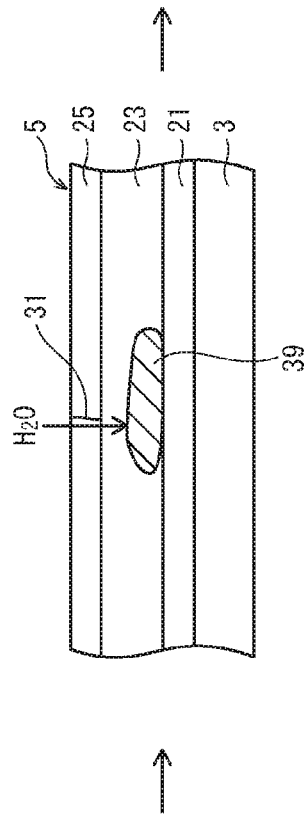
FIGS. 6A to 6D are diagrams for explaining changes in state of the hygroscopic layer of the first embodiment during a manufacturing process of an organic EL device including the hygroscopic layer pertaining to the first embodiment.
Figure 6B:
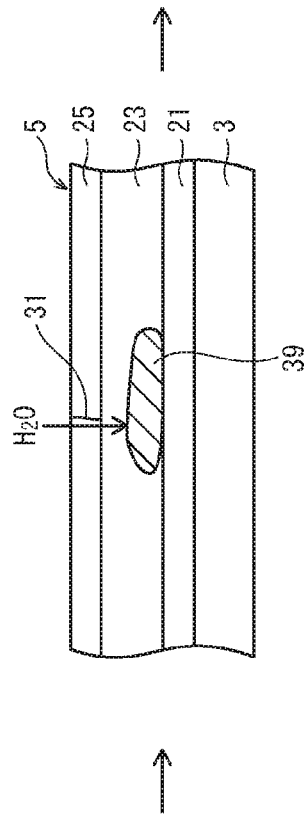

FIG. 6A illustrates a state immediately after formation of the hygroscopic layer 5 on the base 3. As described above, the hygroscopic layer 5 on the base 3 is exposed to ambient air. This leads to moisture intruding into the hygroscopic film 23 via the defects 31. The moisture having intruded into the hygroscopic film 23 is then absorbed/adsorbed by the hygroscopic agent 927, which is contained at a large amount in a region of the hygroscopic film 23 that is close to the first covering film 21 and distant from the display unit 7. In other words, the moisture is absorbed/adsorbed by a region of the hygroscopic film 23 close to the first covering film 21. This state is illustrated in FIG. 6B, in which hatching is used to indicate region 39 having absorbed/adsorbed a large amount of moisture.

Figure 6C:
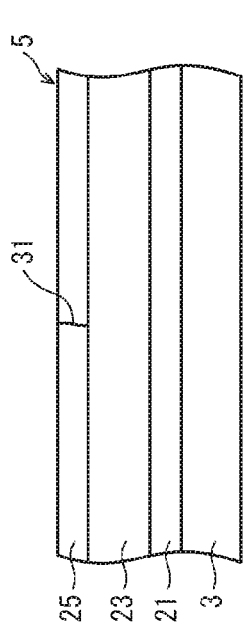
Figure 6D:
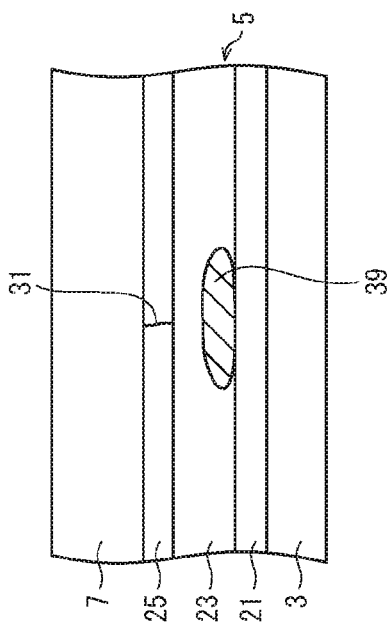

Subsequently, the display unit 7 is formed on the upper surface of the second covering film 25. FIG. 6C illustrates a state immediately after the formation of the display unit 7. Then, heating is performed, for example, in order to cure the resin material of the surface covering layer 11. This heating is illustrated in FIG. 6D.

During the heating, the moisture in the region 39, which contains a large number of hygroscopic agent grains 27 having absorbed/adsorbed moisture, spreads to form a region 39a in which moisture exists. However, due to the hygroscopic agent 27 capable of absorbing/adsorbing moisture being contained at a large amount in the region of the hygroscopic film 23 close to the first covering film 21 (i.e., a region of the hygroscopic layer distant from the second covering film 25) in the first place, moisture discharged from the hygroscopic agent grains 27 as a result of the heating needs to travel a long distance to reach the second covering film 25. Accordingly, the amount of moisture penetrating through the second covering film 25 and reaching the display unit 7 is low.

As such, due to the hygroscopic film 23 in the hygroscopic layer 5 containing the hygroscopic agent 27 at a large amount in a region thereof that is distant from the display unit 7, moisture once absorbed/adsorbed is prevented from spreading towards the display unit 7. Accordingly, degradation of the organic EL device 1 can be prevented.

5. Hygroscopic Film (1) Planarity

As described above, the hygroscopic film 23 contains the hygroscopic agent 27 at a large amount at a portion thereof distant from the display unit 7. This leads to the surface of the hygroscopic film 23 in the direction of the organic EL layer (referred to in the following as an organic EL layer-side surface) having planarity.

Specifically, it is expected that the organic EL layer-side surface of the hygroscopic film 23 would have a level of planarity not producing defects 31 when the low-content region 23b contains the hygroscopic agent 27 at a content rate of 5 vol % or lower. Further, it is preferable that the low-content region 23b, containing the hygroscopic agent 27 at a content rate of 5 vol % or lower, has a thickness greater than an average grain diameter of the hygroscopic agent grains 27, and more preferably, a thickness greater than a maximum grain diameter of the hygroscopic agent grains 27.

Here, the average grain diameter and the maximum grain diameter of the hygroscopic agent grains 27 are those determined by measuring the diameters of at least one hundred hygroscopic agent grains 27 by using a scanning electron microscope (SEM), a transmission electron microscope (TEM), or the like.

Providing the low-content region 23b with such thickness is preferable, since with such thickness, the risk can be reduced of hygroscopic agent grains 27 being exposed from the organic EL layer-side surface of the hygroscopic film 23 even if hygroscopic agent grains 27 do exist in the low-content region 23b.

Further, the probability of the organic EL layer-side surface of the hygroscopic film 23 having planarity is higher when the low-content region 23b does not contain any hygroscopic agent grains 27 (i.e., the low-content region 23b is a zero-content region), compared to when the low-content region 23b contains hygroscopic agent grains 27, however small in amount.

In particular, a further improvement in the planarity of the organic EL layer-side surface of the hygroscopic film 23 can be achieved by providing the zero-content region with a thickness greater than the average grain diameter of the hygroscopic agent grains 27. This is because, even if there exists a hygroscopic agent grain 27 mostly exposed from the high-content region 23a, providing the zero-content region with such thickness increases the probability of the zero-content region (i.e., a resin layer) completely covering such a hygroscopic agent grain 27.

Yet a further improvement in the planarity of the organic EL layer-side surface of the hygroscopic film 23 can be achieved by providing the zero-content region with a thickness greater than the maximum grain diameter of the hygroscopic agent grains 27. This is because, even if there exists a hygroscopic agent grain 27 mostly exposed from the high-content region 23a, providing the zero-content region with such thickness results in the zero-content region (i.e., a resin layer) definitely completely covering such a hygroscopic agent grain 27.

Note that an improvement in the planarity of the organic EL layer-side surface of the hygroscopic film 23 reduces the number of defects 31 in the second covering film 25 occurring due to surface irregularities on the organic EL layer-side surface of the hygroscopic film 23, and thus provides the second covering film 25 with higher moisture resistance.

(2) Spread of Moisture

As described above, the hygroscopic film 23 contains the hygroscopic agent 27 at a portion distant from the display unit 7. Upon application of thermal load to the hygroscopic layer 5 characterized as such, moisture absorbed/adsorbed by the hygroscopic agent 27 spreads inside the hygroscopic film 23, but due to the hygroscopic agent 27 being located distant from the organic EL layer-side surface of the hygroscopic film 23, the risk is reduced of moisture spreading beyond the second covering film 25 towards the display unit 7.

The greater the distance between the hygroscopic agent 27 and the organic EL layer-side surface of the hygroscopic film 23, the greater the extent to which the spread of moisture to the display unit 7 can be suppressed. Preferably, the low-content region 23b between the organic EL layer-side surface of the hygroscopic film 23 and the high-content region 23a is a zero-content region not containing any hygroscopic agent grains 27 at all.

Preferably, the zero-content region is provided with a thickness greater than the average grain diameter of the hygroscopic agent grains 27. This is because, even if there exists a hygroscopic agent grain 27 mostly exposed from the high-content region 23a, providing the zero-content region with such thickness increases the probability of resin material being present between such a hygroscopic agent grain 27 and the second covering film 25, and prevents moisture from reaching the second covering film 25.

Yet preferably, the zero-content region has a thickness at least twice the maximum grain diameter of the hygroscopic agent grains 27. This is because, even if there exists a hygroscopic agent grain 27 mostly exposed from the high-content region 23a, providing the zero-content region with such thickness results in a resin layer having a thickness at least twice the maximum grain diameter of the hygroscopic agent grains 27 (i.e., the zero-content region) definitely completely covering such a hygroscopic agent grain 27, and a gap corresponding to the maximum grain diameter of the hygroscopic agent grains 27 definitely being present between the hygroscopic agent grain 27 exposed from the high-content region 23a and the organic EL layer-side surface of the hygroscopic film 23.

Second Embodiment

In a second embodiment, description is given on an organic EL display device.

1. Outline of Structure

Figure 7:
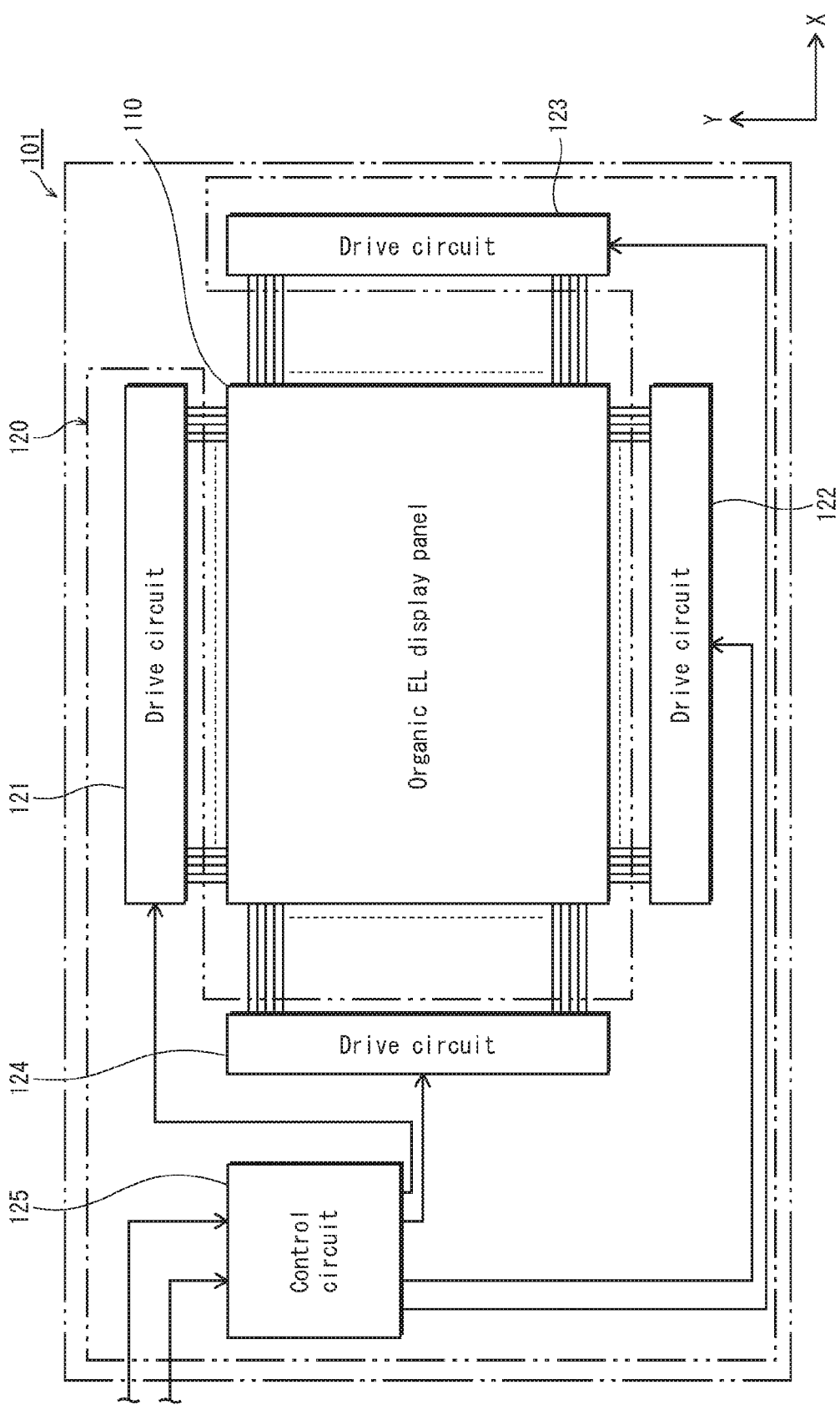
FIG. 7 is a schematic block diagram illustrating the overall structure of an organic EL display device pertaining to a second embodiment.
Figure 8:
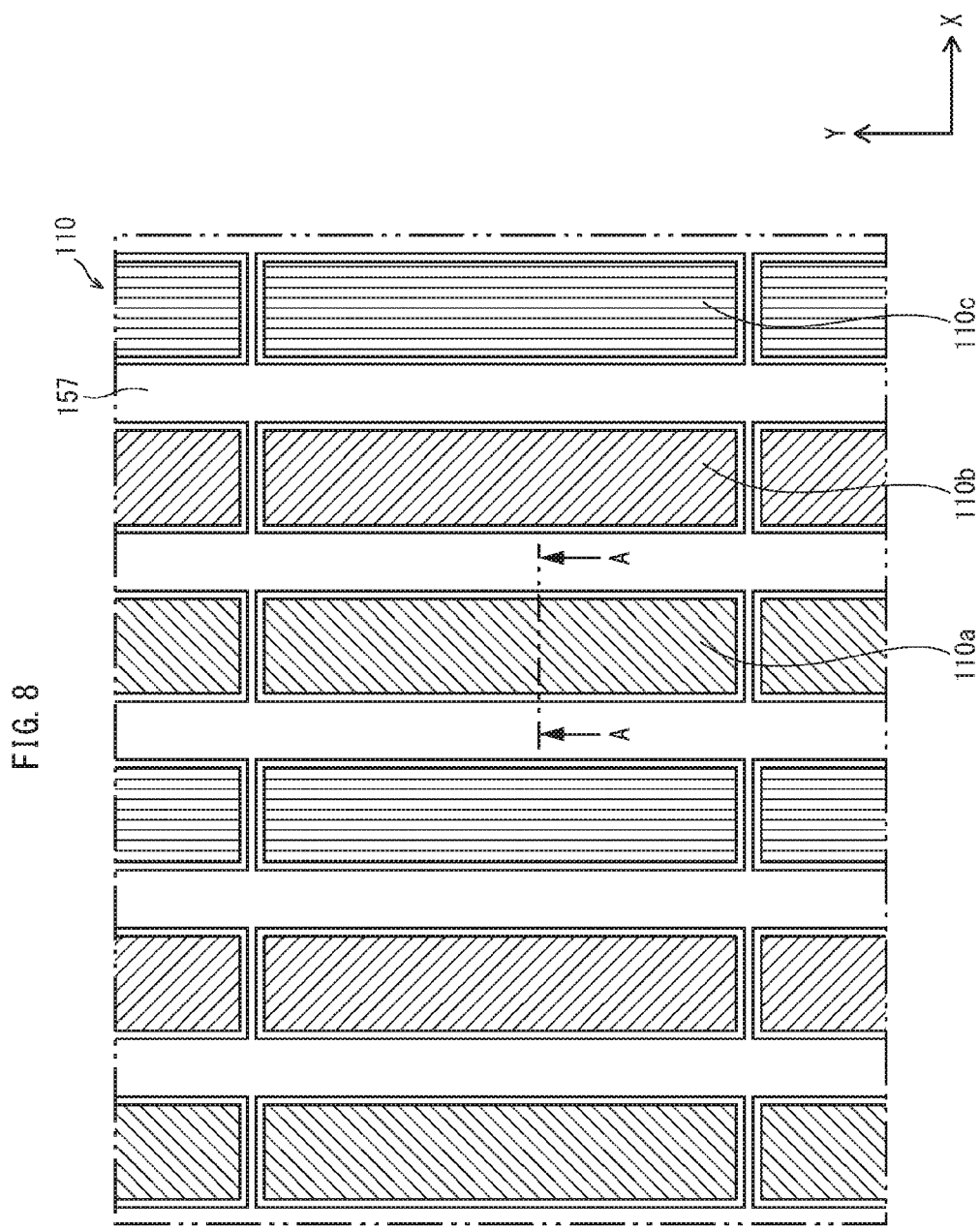
FIG. 8 is a schematic plan view diagram illustrating the arrangement of subpixels in an organic EL display panel.

The following describes the outline of the structure of an organic EL display device 101 pertaining to the second embodiment with reference to FIG. 7 and FIG. 8.

FIG. 7 is a schematic block diagram illustrating the overall structure of the organic EL display device 101 pertaining to the second embodiment. FIG. 8 is a schematic plan view diagram illustrating the arrangement of subpixels 110a-110c in an organic EL display panel 110.

As shown in FIG. 7, the organic EL display device 101 includes the organic EL display panel 110 and a drive/control unit 120 that is connected to the organic EL display panel 110. The organic EL display panel 110 is an organic EL display panel that employs electroluminescence occurring with an organic material. The organic EL display panel 110 here has a curved display surface.

As shown in FIG. 8, subpixels 110a-110c are two-dimensionally arranged, in the X-axis direction and the Y-axis direction. In the second embodiment, each subpixel 110a emits red (R) light, each subpixel 110b emits green (G) light, and each subpixel 110c emits blue (B) light, for example.

Each combination of three adjacent subpixels 110a-110c in the X-axis direction constitutes one pixel as a display function. However, in structural terms, each unit including an anode, an organic EL layer, and a cathode, or in other words, each subpixel, forms one pixel unit.

As shown in FIG. 8, the organic EL display panel 110 includes a bank 157 having a lattice shape (so-called pixel bank). An organic EL layer is formed in each of the regions partitioned by the bank 157 (FIG. 8 illustrates organic EL layers as hatched areas to indicate the regions partitioned by the bank 157, although the organic EL layers are actually not visible in plan view).

Returning to FIG. 7, the drive/control unit 120 includes four drive circuits 121-124 and a control circuit 125. Note that the arrangement of the organic EL display panel 110 and the drive/control unit 120 in the organic EL display device 101 is not limited to that shown in FIG. 7.

Also, each pixel as the display function need not be composed of three subpixels 110a-110c as shown in FIG. 8. Alternatively, each pixel may be composed of four or more subpixels.

2. Structure of Organic EL Display Panel 110

Figure 9:
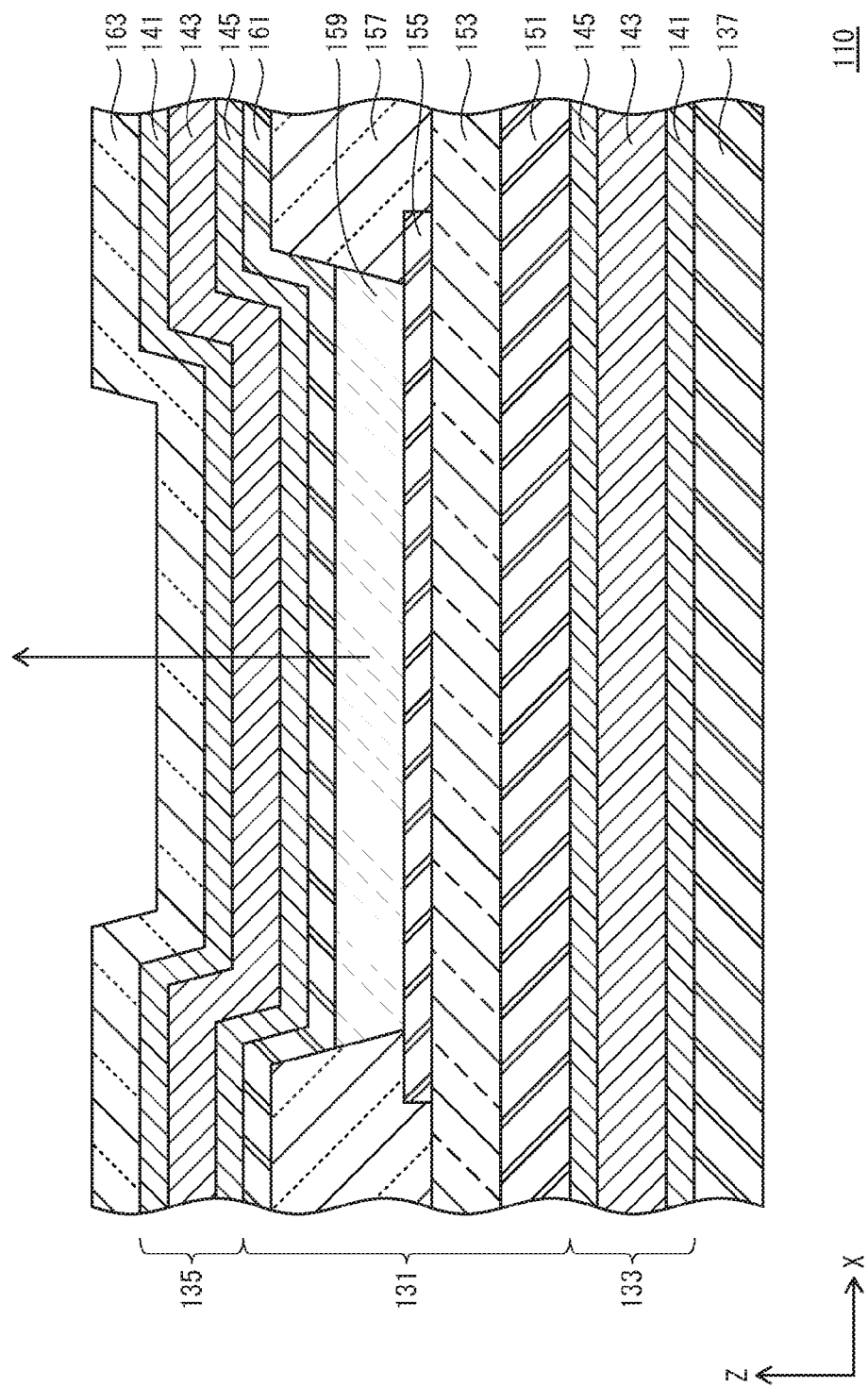
FIG. 9 illustrates an A-A cross-section in FIG. 7, viewed from the direction of arrows.

FIG. 9 illustrates an A-A cross-section in FIG. 8, viewed from the direction of arrows.

As shown in FIG. 9, the organic EL display panel 110 includes a display unit 131 disposed above a base 137 and sandwiched between a pair of hygroscopic layers 133 and 135. The subpixels 110a-110c are two-dimensionally arranged in the display unit 131 in plan view. As shown in FIG. 8, the subpixels 110a-110c are formed in subpixel regions that are partitioned by the bank 157, which defines a plurality of apertures forming a matrix, or that is, a plurality of apertures in each of the X-axis direction and the Y-axis direction, and has a lattice shape as a whole. For example, the bank 157 partitions the subpixel regions to have rectangular shapes.

As shown in FIG. 9, the display unit 131 includes an insulating layer 153 that is disposed on a TFT substrate 151. The Z-axis direction upper surface of the insulating layer 153 is substantially planar. Note that the TFT substrate 151 in the figure is simplified by omitting a TFT layer and so on. An anode 155 is disposed on the subpixel region of the Z-axis direction upper surface of the insulating layer 153.

Next, the bank 157 covers the insulating layer 153 and both X-axis direction ends of the upper surface of the anode 155. In the subpixel region partitioned by the bank 157, an organic EL layer 159 is disposed on the upper surface of the anode 155.

A cathode 161 covers the organic EL layer 159, upper parts of the lateral surfaces of the bank 157, and the upper surfaces of the bank 157. The hygroscopic layer 135 is disposed on the upper surface of the cathode 161. The hygroscopic layer 135 includes a second covering film 145, a hygroscopic film 143, and a first covering film 141.

A surface covering layer 163 is disposed on the upper surface of the hygroscopic layer 135. The surface covering layer 163 has a function of covering and protecting the display unit 131.

The organic EL display panel 110 pertaining to the present embodiment is of a top emission type, and emits light in a Z-axis upper direction as indicated by an arrow in FIG. 9.

3. Materials of Organic EL Display Panel 110

(1) Base

The base 137 needs to have flexibility to be bendable. The base 137 is preferably made for example of a resin material as a flexible material, similar to the base 3 in the first embodiment. Here, a polycarbonate film is used as the base 137.

(2) Hygroscopic Layer

The hygroscopic layer 133 includes the first covering film 141, the hygroscopic film 143, and the second covering film 145 layered one on top of another, similar to the first embodiment. In other words, the hygroscopic layer 133 has a structure where the hygroscopic film 143 is sandwiched between the covering films 141, 145.

Each covering film is formed by using a material having a low moisture vapor transmission rate, more specifically a moisture vapor transmission rate of approximately $1 \times 10^{-4}$ $g/m^2/day$ to $1 \times 10^{-6}$ $g/m^2/day$, inclusive, in an atmosphere of 40 degrees Celsius and 90% RH. Each covering film preferably has as low a moisture vapor transmission rate as possible. Each covering film has local defects, the forming of which cannot be avoided in the manufacturing process.

Each covering film is an inorganic film made of an inorganic material. The inorganic film is for example a thin film of silicon nitride (SiN), silicon oxide ($SiO_2$), silicon oxynitride, or the like, or a metal film of ITO or the like. Here, the covering films 141, 145 are SiN films.

The hygroscopic film 143 absorbs/adsorbs moisture having intruded via the defects in the covering films 141, 145. The hygroscopic film 143 is formed by mixing a hygroscopic agent into an organic material. Here, the hygroscopic agent is aluminum oxide, and the organic material is acrylic resin.

(3) Display Unit (3-1) TFT Substrate

The TFT substrate 151 includes a substrate and a TFT layer that is disposed on the Z-axis direction upper surface of the substrate. Although not shown in the figure, the TFT layer includes three electrodes, namely a gate electrode, a source electrode, and a drain electrode, as well as a semiconductor layer, a passivation layer, and so on.

The substrate is the base of the TFT substrate 151 and is a resin substrate or the like. The resin substrate may be made of thermoplastic resin or thermosetting resin. The resin substrate may be made for example of a single layer of any of the following materials or a laminate of any two or more of the following materials including polyolefin such as polyethylene, polypropylene, ethylene-propylene copolymer, and ethylene-vinylacetate copolymer (EVA), cyclic polyolefin, modified polyolefin, polyvinyl chloride, polyvinylidene chloride, polystyrene, polyamide, polyimide (PI), polyamideimide, polycarbonate, poly-(4-methylpentene-1), ionomer, acrylic resin, polymethyl methacrylate, acrylic-styrene copolymer (AS resin), butadiene-styrene copolymer, polyol copolymer (EVOH), polyester such as polyethylene terephthalate (PET), polybutylene terephthalate, polyethylene naphthalate (PEN), and poly cyclohexane terephthalate (PCT), polyether, polyether ketone, polyether sulfone (PES), polyester imide, polyacetal, polyphenylene oxide, modified polyphenylene oxide, polyarylate, aromatic polyester (liquid crystal polymer), polytetrafluoroethylene, polyvinylidene fluoride, other fluororesin, thermoplastic elastomer such as styrenic elastomer, polyolefin elastomer, polyvinyl chloride elastomer, polyurethane elastomer, fluorine rubber elastomer, and chlorinated polyethylene elastomer, epoxy resin, phenol resin, urea resin, melamine resin, unsaturated polyester resin, silicone resin, polyurethane, or copolymer, blend, polymer alloy or the like mainly including such a material.

(3-2) Insulating Layer

The insulating layer 153 is made for example of an organic compound such as polyimide, polyamide, or an acrylic resin. Here, the insulating layer 153 is preferably resistant to organic solvents.

Also, the insulating layer 153 sometimes undergoes etching processing, baking processing, and so on in the manufacturing process, and accordingly should preferably be made of a highly resistant material in order to avoid excessive distortion and transformation due to such processing.

(3-3) Anode

The anode 155 is made of a metal material including silver (Ag) or aluminum (Al). The organic EL display panel 110 pertaining to the present embodiment is of the top emission type, and thus, the surface portion of the anode 155 should preferably have high optical reflectivity.

The anode 155 need not have a single-layer structure of a metal material such as described above, and alternatively may be a laminate of a metal layer and a transparent conductive layer. The transparent conductive layer is made for example of ITO, indium zinc oxide (IZO), or the like.

(3-4) Bank

The bank 157 is made of an electrically-insulative organic material such as resin. The organic material of the bank 157 is for example acrylic resin, polyimide resin, or novolac-type phenol resin.

(3-5) Organic EL Layer

The organic EL layer 159 has a function of emitting light by excitation resulting from injection and recombination of holes and electrons. The organic EL layer 159 is made of a light-emitting organic material a film of which can be formed through wet printing.

Specifically, the organic EL layer 159 should preferably be made for example of a fluorescent substance disclosed in Japanese Patent Application Publication No. H05-163488, such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, and metal complex of 8-hydroxyquinoline compound, metal complex of 2-bipyridine compound, complex of a Schiff base and group III metal, oxine metal complex, and rare earth complex.

(3-6) Cathode

The cathode 161 is made for example of ITO or IZO. The organic EL display panel 110 pertaining to the present embodiment is of the top emission type, and accordingly the cathode 161 needs to be made of a light-transmissive material.

(4) Hygroscopic Layer

The hygroscopic layer 135 may be made of the same material as the hygroscopic layer 133 or a different material from the hygroscopic layer 133. The hygroscopic layer 135 here is made of the same material as the hygroscopic layer 133. The organic EL display panel 110 pertaining to the present embodiment is of the top emission type, and accordingly the hygroscopic layer 135 needs to be made of a light-transmissive material.

(5) Surface Covering Layer

The surface covering layer 163 covers the display unit 131. The surface covering layer 163 has a function of protecting the display unit 131 from being damaged by shock and so on and a function of preventing the display unit 131 from being directly exposed to moisture, air, etc.

For example, the surface covering layer 163 is formed by using silicon nitride (SiN), silicon oxynitride (SiON), or the like. The surface covering layer 163 may have a multi-layer structure where a layer made of a resin material such as acrylic resin or silicone resin is layered on a layer made of a material such as SiN or SiON.

The organic EL display panel 110 pertaining to the present embodiment is of the top emission type, and accordingly the surface covering layer 163 needs to be made of a light-transmissive material.

Third Embodiment

The hygroscopic layer is effective with respect to a function unit undergoing some kind of functional degradation through moisture sorption. In the second embodiment, a resin film having flexibility is used as the base 137. However, a conventional glass material may be used as base material. In a third embodiment, description is given on an organic EL device (organic EL display device) whose base is made of a glass material and which includes a hygroscopic layer disposed at a surface portion thereof.

1. Overall Structure

Figure 10:
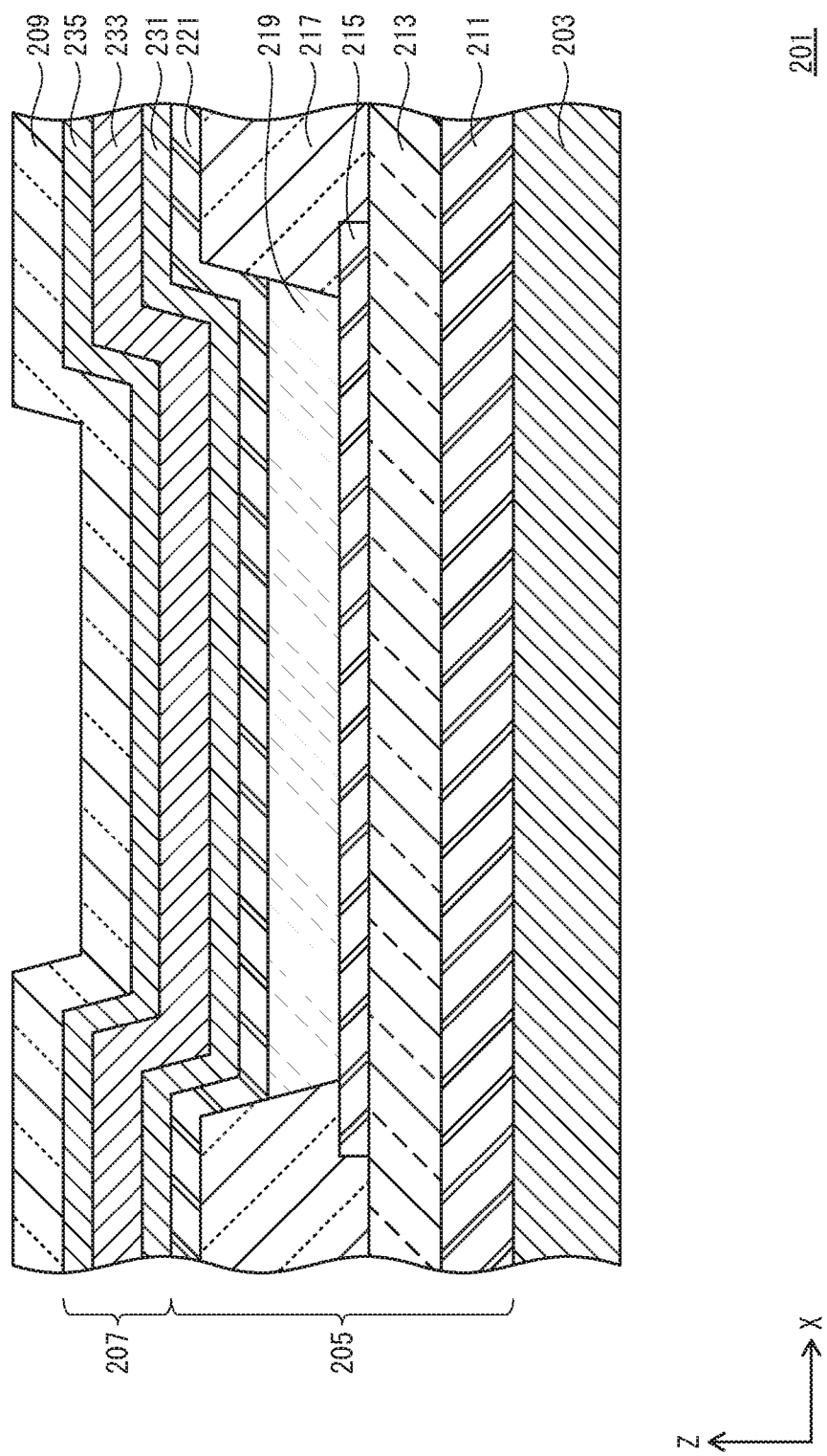
FIG. 10 is a cross-sectional diagram illustrating a part of an organic EL display panel corresponding to one subpixel.

FIG. 10 is a cross-sectional view showing one subpixel of an organic EL display panel 201.

In the organic EL display panel 201, a display unit 205 is disposed on a base 203 and is covered with a hygroscopic layer 207. A plurality of subpixels are two-dimensionally arranged in the display unit 205 in plan view, as in the second embodiment. Further, the third embodiment is similar to the second embodiment in terms of the basic structure of the subpixels of the respective colors. Accordingly, in the following, the subpixels are described without special distinction between colors.

More specific explanations are provided below.

2. Structure of Components (1) Base

Differing from the base 137 in the second embodiment, the base 203 is not freely bendable. In other words, the base 203 is made of a material not having a practical level of flexibility. Here, the base 203 is made of a glass material. Glass material has a low moisture vapor transmission rate, unlike the resin material of the base 137 described in the second embodiment. For this reason, no hygroscopic layer needs to be provided between the base 203 and the display unit 205. Nevertheless, a hygroscopic layer may be provided between the base 203 and the display unit 205, which is beneficial in that, for example, the display unit 205 can be provided with an increased operating life, and the thickness of the base 203 can be reduced.

(2) Display Unit

The display unit 205 includes an insulating layer 213 that is disposed on a TFT substrate 211 which serves as a base. An anode 215 is disposed on a subpixel region of the upper surface of the insulating layer 213. A bank 217 covers the insulating layer 213 and both X-axis direction ends of the upper surface of the anode 215. An organic EL layer 219 is formed in the subpixel region, which is partitioned by the bank 217.

A cathode 221 covers the organic EL layer 219, upper parts of the lateral surfaces of the bank 217, and the upper surfaces of the bank 217.

(3) Hygroscopic Layer

Similar to the second embodiment, the hygroscopic layer 207 includes a first covering film 231, a hygroscopic film 233, and a second covering film 235.

Here, each covering film is formed by using an inorganic material, and for example, is a silicon nitride film. The hygroscopic film 233 contains zeolite grains as a hygroscopic agent, and polycarbonate resin as a resin material.

Here, the first covering film 231, which is in contact with the display unit 205 (or disposed close to the display unit 205), is provided with greater thickness than the second covering film 235.

(4) Surface Covering Layer

The surface covering layer 209 is formed by using an inorganic material such as silicon nitride. Note that the second covering film 235 of the hygroscopic layer 207 may be formed by using an inorganic material, in which case the surface covering layer 209 may also serve as the second covering film 235.

[Modifications]

1. Organic EL Layer

In the second and third embodiments, a hygroscopic layer is applied for the purpose of preventing moisture intrusion into an organic EL layer (organic EL layers 159, 219). Meanwhile, a hygroscopic layer may also be applied for the purpose of preventing moisture intrusion into a functional layer other than an organic EL layer. That is, a hygroscopic layer may be provided with respect to any functional layer whose function undergoes degradation due to moisture sorption.

Functional layers are included for example in electronic components such as a TFT layer, a thin-film coil, a thin-film transistor, an organic transistor, and a thin-film filter, function units of electronic devices such as an electronic paper, a solar battery, and a thin-film lithium ion battery.

2. Hygroscopic Layer (1) Structure

In each embodiment, only one hygroscopic layer (hygroscopic layers 5, 9, 133, 135, 207) is provided per one main surface of a display unit (display units 7, 131, 205). However, for example, a plurality of hygroscopic layers may be provided per main surface, such as a main surface of a display unit. This further improves moisture resistance.

Furthermore, one hygroscopic layer (hygroscopic layers 5, 9, 133, 135, 207) includes one hygroscopic film (hygroscopic films 23, 143, 233), and a pair of one first covering film (first covering films 21, 141, 231) and one second covering film (second covering films 25, 145, 235). However, a plurality of covering films may be provided per main surface of a hygroscopic film, as long as at least one covering film is provided per main surface of a hygroscopic film. When providing a plurality of covering films per main surface of a hygroscopic film, the number of covering films provided with respect to one main surface of the hygroscopic film may be equal to or differ from the number of covering films provided with respect to the other main surface of the hygroscopic film. Further, the plurality of covering films provided in such a case may have the same structure or different structures.

Further, a hygroscopic layer may include a plurality of hygroscopic films. For example, a hygroscopic layer may include: a first covering film; a first hygroscopic film; a second covering film; a second hygroscopic film; and a third covering film disposed in the stated order. Further, the plurality of hygroscopic films provided in such a case may have the same structure or different structures.

(2) Hygroscopic Film

A hygroscopic film (hygroscopic films 23, 143, 233) includes one type of hygroscopic agent 27. However, a hygroscopic film may include a plurality of types of hygroscopic agents. Further, when providing a plurality of hygroscopic films, the hygroscopic films may include the same type of hygroscopic agent but different types of organic materials, or may include different types of hygroscopic agents but the same type of organic material. Note that even when making such modifications, a region of a hydroscopic film that is in contact with a second covering film, which is a covering film close to an organic EL layer, contains a hygroscopic agent at a relatively small amount.

In the first embodiment, a hygroscopic film (hygroscopic film 23) is largely divided into one high-content region 23a and one low-content region 23b. However, a hygroscopic layer is not limited to having such a structure, as long as a region of a hydroscopic film that is in contact with a second covering film, which is a covering film close to an organic EL layer, contains a hygroscopic agent at a relatively small amount. For example, when a hydroscopic film has a structure where a plurality of high-content regions and a plurality of low-content regions (and/or zero-content regions) are layered in alternation, a region of the hygroscopic film that is in contact with a second covering film needs to be a low-content region (or a zero-content region).

When making such a modification, the thickness of a low-content region (or a zero-content region) is preferably greater than an average grain diameter of hygroscopic agent grains, and more preferably greater than a maximum grain diameter of the hygroscopic agent grains, and yet further preferably is at least twice the maximum grain diameter of the hygroscopic agent grains.

Figure 11:
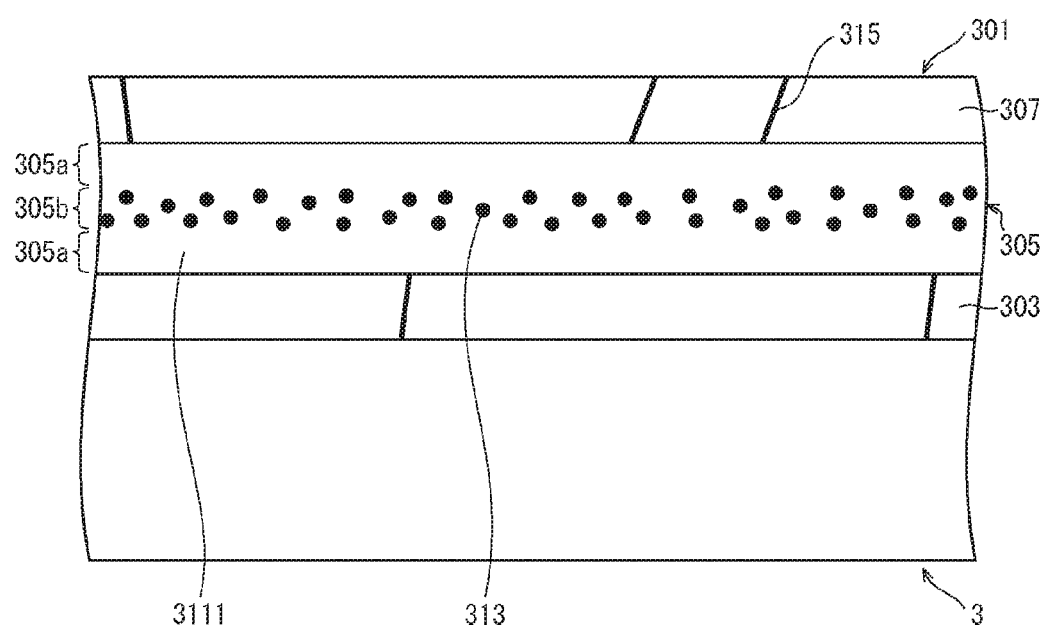
FIG. 11 is a cross-sectional diagram of a base layer with a hygroscopic layer whose hygroscopic film includes two zero-content regions formed thereon.

FIG. 11 is a cross-sectional diagram illustrating a state where a hygroscopic layer whose hygroscopic film has two zero-content regions has been formed on a base.

The hygroscopic layer 301 in the example illustrated in FIG. 11 is formed on the upper surface of the base 3. The hygroscopic layer 301 includes a first covering film 303, a hygroscopic film 305, and a second covering film 307, layered in the stated order from the side of the base 3. The hygroscopic film 305 contains a resin material 311 and a hygroscopic agent 313 mixed in the resin material 311.

The hygroscopic film 305 includes low-content regions 305a that do not contain much hygroscopic agent grains 313, and a high-content region 305b that contains a larger amount of hygroscopic agent grains 313 than the low-content regions 305a. Here, the low-content regions 305a may be zero-content regions that do not contain any hygroscopic agent grains 313 at all.

Here, the low-content regions 305a and the high-content region 305b, each of which is in a form of a layer, are disposed in the order of a first low-content region 305a, the high-content region 305b, and a second low-content region 305a, from the side of the first covering film 303.

(3) Absorbent/Adsorbent

In the embodiments, a hygroscopic agent (hygroscopic agent 27) absorbs/adsorbs moisture. Alternatively, an absorbent/adsorbent that absorbs a different type of gas (e.g., oxygen) may be used. This modification also enables setting operating life in consideration of covering film defects, by performing experiments and grasping absorption/adsorption performance of the absorbent/adsorbent with respect to what is to be adsorbed/adsorbed by the absorbent/adsorbent.

3. Device

Each of the first through third embodiments describes an organic EL device (organic EL device 1) or an organic EL display device (organic EL display devices 110, 201) that includes, with respect to one display unit (display units 7, 131, 205), one or two hygroscopic layers (hygroscopic layers 5 and 9, hygroscopic layers 133 and 135, hygroscopic layer 207). Alternatively, in an organic EL device, a part of the structure of a display unit may serve as a second covering film of a hygroscopic layer, which is a covering film relatively close to the display unit.

For example, the display unit 131 in the second embodiment includes the cathode 161. For example, when the cathode 161 is a film formed by performing sputtering and using a metal oxide such as ITO or IZO, this film may be used as a second covering film of a hygroscopic layer, which is a covering film located relatively close to a function unit.

4. Display Unit

In each of the second and third embodiments, the basic structure of a display unit (display units 131, 205) is described. Meanwhile, a display unit may for example include a hole injection layer, a hole transport layer, an electron transport layer, an electron injection layer, and so on.

In each of the second and third embodiments, a display unit (display units 131, 205) of the top emission type is described. Alternatively, a display unit may be of the bottom emission type. In this case, a base needs to be formed by using a light-transmissive material, an electrode close to the base (lower electrode) needs to be a transparent electrode, and an electrode distant from the base (upper electrode) needs to be a light-reflective electrode.

In each of the second and third embodiments, an anode (anodes 155, 215) is disposed close to a base (bases 137, 203). Alternatively, a cathode may be disposed near a base, for example.

In the second embodiment, description is provided based on an example where an organic EL display device is a color organic EL display device. However, an organic EL display device may be a monochrome organic EL display device, for example.

Furthermore, subpixel configurations of organic EL display devices described in the second and third embodiments may be employed and applied to an organic EL light-emitting device having dimming and toning functions. In other words, organic EL layers in the embodiments are applicable for example to organic EL devices such as organic EL display devices and organic EL light-emitting devices.

INDUSTRIAL APPLICABILITY

The present disclosure is useful for preventing moisture intrusion into an organic EL layer that undergoes functional degradation through moisture sorption.

LIST OF REFERENCE SIGNS

1 Functional device
5 Hygroscopic layer
7 Display unit
9 Hygroscopic layer
21 First covering film
23 Hygroscopic film
25 Second covering film

The invention claimed is:

1. An organic electroluminescence (EL) device comprising:
   an organic EL layer; and
   a hygroscopic layer disposed with respect to at least one main surface of the organic EL layer, wherein
   the hygroscopic layer includes:
      a hygroscopic film containing a base material and a hygroscopic agent mixed in the base material; and
      a pair of covering films each covering a different one of surfaces of the hygroscopic film in a thickness direction of the hygroscopic film, and
   a region of the hygroscopic film that is in contact with one of the covering films whose distance from the organic EL layer is smaller than a distance of the other one of the covering films from the organic EL layer contains the hygroscopic agent, and a content rate of the hygroscopic agent in the region is lower than an average content rate of the hygroscopic agent in the hygroscopic film.

2. The organic EL device according to claim 1, wherein the region of the hygroscopic film is in contact with an entirety of the one of the covering films.

3. The organic EL device according to claim 1, wherein the region of the hygroscopic film has a thickness greater than an average diameter of grains of the hygroscopic agent.

4. The organic EL device according to claim 1, wherein the region of the hygroscopic film contains the hygroscopic agent at a content rate of 5 vol % or lower.

5. The organic EL device according to claim 1, wherein the hygroscopic agent is zeolite.

6. The organic EL device according to claim 1, wherein the hygroscopic layer is composed of the hygroscopic film and the pair of covering films.

* * * * *